United States Patent [19]
Klein et al.

[11] Patent Number: 5,140,500
[45] Date of Patent: Aug. 18, 1992

[54] HOUSING FOR ELECTRONIC CIRCUIT

[75] Inventors: Gerhard Klein, Gifhorn-Gamsen; Dieter Hussmann, Steinheim; Dieter Karr, Tiefenbronn; Karl Schupp, Pforzheim, all of Fed. Rep. of Germany

[73] Assignee: Robert Bosch GmbH, Stuttgart, Fed. Rep. of Germany

[21] Appl. No.: 705,326

[22] Filed: May 24, 1991

[30] Foreign Application Priority Data

Jun. 20, 1990 [DE] Fed. Rep. of Germany ....... 9006916

[51] Int. Cl.$^5$ ............................................. H05K 7/20
[52] U.S. Cl. ................................. 361/388; 361/386
[58] Field of Search ............... 361/383, 384, 386–389, 361/413

[56] References Cited

U.S. PATENT DOCUMENTS 4,833,569  5/1989  Probst .................... 361/383

FOREIGN PATENT DOCUMENTS 3712235  10/1988  Fed. Rep. of Germany ...... 361/386

Primary Examiner—Gregory D. Thompson
Attorney, Agent, or Firm—Michael J. Striker

[57] ABSTRACT

A housing for an electronic circuit, especially for a control electronic device of a motor vehicle, has a printed circuit board adapted to carry an electronic circuit, a plug strip, a front plate, a cooling frame mounted on the board and having at least one cooling portion, power elements connected with the cooling portion in a heat conductive manner. The front plate is provided with cooling ribs and the cooling frame is provided with at least one cooling leg facing toward the plug strip so that the plug strip is located between the front plate with the cooling ribs and the cooling leg of the cooling frame. The front plate and the cooling frame are connected through a heat conducting web on the front plate in a heat conducting manner.

6 Claims, 1 Drawing Sheet

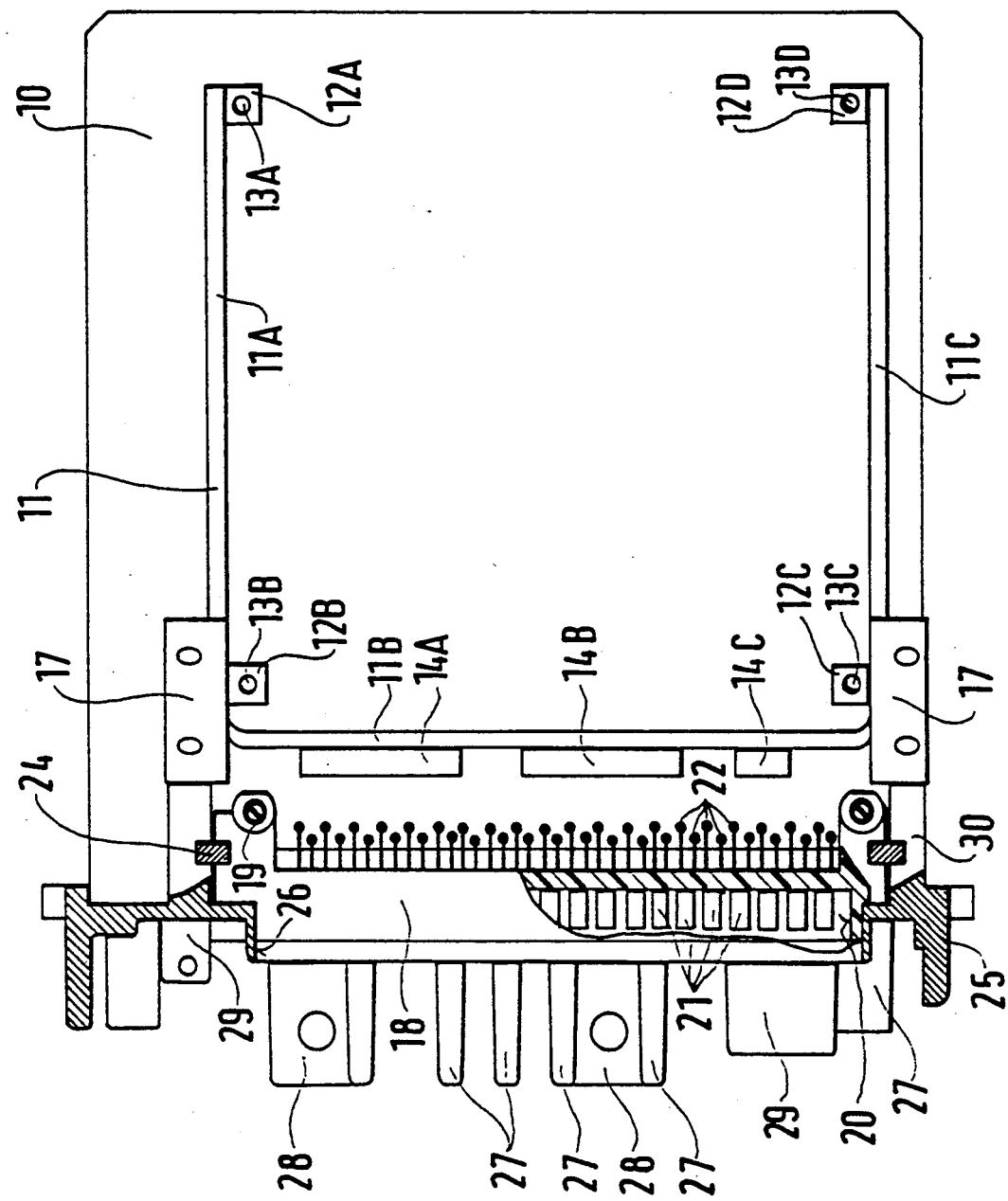

HOUSING FOR ELECTRONIC CIRCUIT

BACKGROUND OF THE INVENTION

The present invention relates to a housing for an electronic circuit. More particularly it relates to such a housing which has a plug strip, a front plate and a cooling frame with a printed circuit board mounted on it and having at least one cooling portion with power elements connected with the board in a heat conductive manner.

Housings of the above mentioned general type are known in the art. One of such housings is disclosed for example in the German document DE-OS 2,546,334. A cooling frame is accommodated in the housing and has chambers and a body located above the printed circuit board for mounting highly heating structural or power elements. The construction of the housing, especially the construction of the cooling frame is complicated since it is composed of a special profile. Moreover the heat withdrawal of the power elements is to be improved since the heat conducting paths are relatively long.

SUMMARY OF THE INVENTION

Accordingly, it is an object of the present invention to provide a housing for an electronic circuit, which avoids the disadvantages of the prior art.

In keeping with these objects and with others which will become apparent hereinafter, one feature of the present invention resides, briefly stated, in a housing for an electronic circuit in which the plug strip is located between the front plate provided with the cooling ribs and a cooling leg which has at least one structural element to be cooled and faces the plug strip, and the front plate and the cooling frame are connected through heat conducting webs on the front plate, extending in the plug-in element on the cooling frame.

When the housing is designed in accordance with the present invention, it achieves the above mentioned advantages.

The heat conducting paths from the power elements to the cooling body are short. The electrical conducting paths are short due to the small distance of the power elements to the plug strip. Thereby the electromagnetic compatibility of the circuit is improved. Moreover, a relatively free spatial design of the cooling frame is possible without changing the front plate. The thermal connection of the cooling frame is good with high manufacturing and mounting tolerances. The cooling frame has a simple construction, so that its production does not require cost intensive manufacturing steps.

The arrangement of the conductive elements on the cooling frame and the arrangement of the cooling frame as well as the construction of the same provided for the advantage that the mounting can be performed automatically, and for producing the solder connections only a single soldering step is required. Moreover, so-called printed circuit board units can be utilized, on which several equipped printed circuit boards with cooling frames can be arranged and simultaneously moved through a soldering bath. After the soldering, the individual printed circuit boards can be broken from the printed circuit board units or punched from them. The production is therefore very economical.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

The single FIGURE of the drawings is a view showing a housing for an electrical circuit in accordance with the present invention.

DESCRIPTION OF A PREFERRED EMBODIMENT

A housing of the invention has a printed circuit board identified in the drawing with reference numeral 10. It carries a not shown electronic circuit. The electronic circuit can be for example a control circuit of an internal combustion engine of a motor vehicle. A cooling frame 11 is mounted on the upper side of the board 10. It has three legs 11A, 11B, 11C which together form a rectangle. Mounting latches 12A, 12B, 12C, 12D with openings 13A, 13B, 13C, 13D are arranged on the sides of the cooling legs 11A, 11C which face toward the interior of the frame. These formations serve for screwing or riveting the cooling frame 11 on the board 10 in a not shown manner. Power elements 14A, 14B, 14C are mounted on the cooling leg 11B and more particularly on the outer side of the frame. Their rear sides have a surface contact with the cooling leg 11B, having high heat conduction. The power elements 14A, 14B, 14C are connected with the board 10 by not shown connecting wires.

Elongated plug elements, formed for example as latches 17 are provided on the outer sides of the cooling legs 11A and 11C. They extend substantially in the region of the cooling leg 11B.

A plug strip 18 is mounted on the board 10 by screws 19. It is located before the outer region of the cooling leg 11B. A rim-shaped frame 20 is arranged on the strip 18 and the plug contacts 21 extend in the frame 20. The plug contacts 21 are connected with the board end by connecting wires 22.

A front plate 25 of a good heat conducting material has a ring-shaped opening 26 and is mounted on the plug strip 18 by an arresting means formed as an arresting comb 24 or in another suitable way. It is mounted so that the frame 20 extends through the opening 26. The front plate 25 at its side facing away of the plug strip 18 is provided with cooling ribs 27, mounting latches 28 and guiding elements 29 for a plug connection. The front plate on its side facing the plug strip 18 is provided with elongated cooling webs 30. The cooling webs extend near the plug strip 18 and project into the region of the latches 17 of the cooling frame 11. There they are mounted by suitable mounting means, for example screws or leaf springs so that the cooling webs 30 with the latches have a good heat conducting surface contact.

The structural assembly including the printed circuit board 10, cooling frame 11, plug strip 18 and front plate 25 is arranged in a not shown plug-in housing. The front plate 25 and the housing are connected with one another by screws, rivets or clamps.

It will be understood that each of the elements described above, or two or more together, may also find a useful application in other types of constructions differing from the types described above.

While the invention has been illustrated and described as embodied in a housing for an electronic circuit, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

We claim:

1. A housing for an electronic circuit, especially for a control electronic device of a motor vehicle, comprising a printed circuit board adapted to carry an electronic circuit; a plug strip; a front plate; and a cooling frame mounted on said board and having at least one cooling portion; and at least one power element, said front plate being provided with cooling ribs and said cooling frame being provided with at least one cooling leg carrying said power element and facing toward said plug strip, said plug strip being located between said front plate provided with said cooling ribs and said cooling leg of said cooling frame, said front plate and said cooling frame being connected through a heat conducting web on said front plate in a heat conducting manner.

2. A housing as defined in claim 1; and further comprising a plug element arranged on said cooling frame so that said front plate extends into said plug element on said cooling frame.

3. A housing as defined in claim 1; and further comprising means for connecting said plug strip with said front plate.

4. A housing as defined in claim 3, wherein said connecting means includes arresting means which connects said plug strip with said front plate.

5. A housing as defined in claim 1, wherein said cooling frame includes a plurality of cooling legs which are substantially perpendicularly to one another and connected to said at least one cooling leg.

6. A housing as defined in claim 3, wherein said cooling frame includes a plurality of cooling legs which are substantially perpendicularly to one another and connected to said at least one cooling leg.

* * * * *